United States Patent
Wang et al.

(10) Patent No.: US 10,656,667 B2
(45) Date of Patent: May 19, 2020

(54) MOVABLE HANDLE

(71) Applicant: FIVETECH TECHNOLOGY INC., New Taipei (TW)

(72) Inventors: Ting-Jui Wang, New Taipei (TW); Chia-Ching Liao, New Taipei (TW)

(73) Assignee: FIVETECH TECHNOLOGY INC. (TW)

( * ) Notice: Subject to any disclaimer, the term of this patent is extended or adjusted under 35 U.S.C. 154(b) by 179 days.

(21) Appl. No.: 15/430,948

(22) Filed: Feb. 13, 2017

(65) Prior Publication Data

US 2017/0242452 A1  Aug. 24, 2017

(30) Foreign Application Priority Data

Feb. 19, 2016  (TW) .............................. 105202437 A

(51) Int. Cl.
| | |
|---|---|
| *G05G 1/04* | (2006.01) |
| *H05K 7/14* | (2006.01) |
| *G05G 5/04* | (2006.01) |
| *G05G 5/05* | (2006.01) |
| *G05G 7/00* | (2006.01) |

(52) U.S. Cl.
CPC ................ *G05G 1/04* (2013.01); *G05G 5/04* (2013.01); *G05G 5/05* (2013.01); *G05G 7/00* (2013.01); *H05K 7/1411* (2013.01)

(58) Field of Classification Search
CPC .. G05G 1/04; G05G 5/04; G05G 5/05; G05G 7/00; H05K 7/1411; B60T 7/105
See application file for complete search history.

(56) References Cited

U.S. PATENT DOCUMENTS

| | | | | | |
|---|---|---|---|---|---|
| 4,455,775 | A | * | 6/1984 | Fritzinger ................. | G09F 7/18 40/607.11 |
| 5,159,850 | A | * | 11/1992 | Naoi ....................... | B60T 7/105 74/523 |

FOREIGN PATENT DOCUMENTS

JP           02204134 A  *  8/1990

\* cited by examiner

*Primary Examiner* — Thomas C Diaz
(74) *Attorney, Agent, or Firm* — Schmeiser, Olsen & Watts, LLP

(57) ABSTRACT

A movable handle includes a movable member and a seat, both of which can be made of a plastic, a metal or a composite material. The movable member includes a main body and a bent portion. The main body can be bar-shaped, block-like, ball-shaped, wedge-shaped or in any other suitable shape, and the bent portion can be bent inward, outward or in any other direction relative to the main body. The main body of the movable member is movably assembled to the seat, and the seat is connected to a first object, such that the movable member is indirectly connected to the first object via the seat and can be turned or moved upward and downward or leftward and rightward on and relative to the first object.

2 Claims, 21 Drawing Sheets

MOVABLE HANDLE

CROSS-REFERENCE TO RELATED APPLICATION

This non-provisional application claims priority under 35 U.S.C. § 119(a) on Patent Application No(s). 105202437 filed in Taiwan, R.O.C. on Feb. 19, 2016, the entire contents of which are hereby incorporated by reference.

FIELD OF THE INVENTION

The present invention relates to a handle, and more particularly, to a movable handle having a seat, which is connected to a first object, and a movable member assembled to the seat and can be turned or moved upward, downward, leftward or rightward relative to the seat.

BACKGROUND OF THE INVENTION

Conventionally, the mounting structure on a handle for connecting the handle to a chassis of an electric product or some other object usually includes a threaded hole provided near an end of the handle and a through hole provided on the chassis or the object. A screw is extended from a rear side of the through hole to be locked to the threaded hole on the handle, such that the handle is fixed to the chassis or the object. With the above mounting structure, the handle connected to the chassis or the object is not permitted to move, such as to rotate or to move upward and downward or leftward and rightward, relative to the chassis or the object. To provide a movable handle, other special assembling structure must be additionally designed. In the case of a conventional movable handle assembling structure that involves a relatively complicated structure, it requires increased manufacturing cost and is therefore less competitive in the market. On the other hand, in the case of a conventional movable handle assembling structure that involves only simple screws or nuts, the screw heads or the nuts will have one side in contact with one surface of the handle. When the handle is operated and turned, it tends to bring the screws or the nuts to rotate along with it to finally cause loosened screws or nuts. Therefore, it is an object of the present invention to develop a movable handle that has simple structure and does not require high manufacturing cost, and can be turned or be moved upward and downward or leftward and rightward without the problem of causing loosened screws or nuts.

SUMMARY OF THE INVENTION

In view of the drawbacks of the conventional handles mounted on chassis or other objects, it is a primary object of the present invention to develop a movable handle that can be turned or be moved upward and downward or leftward and rightward and can be used to actuate another functional member.

To achieve the above and other objects, the movable handle provided according to an embodiment of the present invention preferably includes a movable member and a seat. The movable member includes a main body, which is movably assembled to the seat, such that the movable member is movable relative to the seat.

In the above embodiment, the movable member also includes a bent portion.

In the above embodiment, the movable member can be turned or be moved upward and downward or leftward and rightward relative to the seat.

In the above embodiment, the movable member includes a first coupling section for movably assembled to the seat; or alternatively, the seat includes a second coupling section, to which the main body of the movable member is movably assembled.

In the above embodiment, the first or the second coupling section can be configured as a fastening section, a threaded section, a boss section, a female fastener, a male fastener, a protruded section, a recessed section, or a strip.

In the above embodiment, the seat includes a connecting section for connecting to a first object by way of screw fastening, snap-on fastening, riveting, expanded connection, welding, glue bonding or magnetic fastening.

In the above embodiment, the movable handle further includes an elastic element disposed between the main body of the movable member and the seat, such that the elastic element has an end pushing against the main body of the movable member and another end pushing against the seat.

In the above embodiment, the movable handle further includes a sleeve fitted around the elastic element to limit a range within which the elastic element can move.

In the above embodiment, the elastic element is disposed between the first coupling section and the second coupling section.

In the above embodiment, the main body of the movable member and the seat have a first abutting section and a second abutting section, respectively; and the elastic element has an end interfered by the first abutting section and another end interfered by the second abutting section.

In the above embodiment, the elastic element can be a coil spring, a torsion spring, a flat spring or an elastic bar.

In the above embodiment, the elastic element can be a torsion spring capable of driving the movable member to turn.

In the above embodiment, the elastic element can exert a spring force on the movable member and therefore produces a frictional resistance between the movable member and the seat or the elastic element when the movable member is moved.

In the above embodiment, when the movable member is moved, the bent portion or some other portion of the movable member is brought to actuate an actuator member that can actuate some intended function.

In the above embodiment, the actuator member is installed on a second object or on the first object.

In the above embodiment, the movable member and the seat are respectively made of a plastic material, a metal material or a composite material.

To achieve the above an other objects, the movable handle provided according to another embodiment of the present invention includes a movable member and a seat. The movable member is movably assembled to the seat and can therefore be moved relative to the seat.

In the above embodiment, the seat includes a connecting section for connecting to a first object by way of screw fastening, snap-on fastening, riveting, expanded connection, welding, glue bonding or magnetic fastening.

In the above embodiment, the seat is provided with a cavity, and the movable member is movably mounted to the cavity.

In the above embodiment, there is a retraction space defined between the cavity and the movable member.

In the above embodiment, the movable member is provided with a working section that is movable inside the seat or outside the seat.

In the above embodiment, the working section can be caused to move a second object.

In the above embodiment, the movable handle further includes an elastic element, which has an end pushing against the movable member and another end pushing against the seat.

In the above embodiment, the movable handle further includes a sleeve, which is fitted around the elastic element to limit a range within which the elastic element can move.

In the above embodiment, the movable member includes an interfering section, which is assembled to or integrally formed with the movable member.

In the above embodiment, the seat is provided with an elongated slot or hole, within which the interfering section is movable.

In the above embodiment, the interfering section includes a working section; and the working section is movable inside the seat or outside the seat.

In the above embodiment, the working section can be caused to move a second object.

In the above embodiment, the movable handle further includes an elastic element, which has an end pushing against the movable member and another end pushing against the seat.

In the above embodiment, the movable handle further includes a sleeve, which is fitted around the elastic element to limit a range within which the elastic element can move.

In the above embodiment, the movable member has an actuation portion for causing another member to move and a corresponding movable member that can be moved correspondingly.

In the above embodiment, the movable member has an operation portion for operating the actuation portion.

In the above embodiment, the actuation portion of the movable member drives the corresponding movable member to move.

In the above embodiment, the actuation portion of the movable member drives the corresponding movable member at a head portion or a body portion thereof for the corresponding movable member to move.

In the above embodiment, the actuation portion of the movable member drives the corresponding movable member to move a working section.

In the above embodiment, the actuation portion or the head portion thereof has a bevel surface, a cambered surface or a curved surface.

In the above embodiment, the movable handle further includes an elastic element, which has an end pushing against the movable member and another end pushing against the seat.

In the above embodiment, the movable handle further includes a sleeve, which is fitted around the elastic element to limit a range within which the elastic element can move.

In the above embodiment, the movable handle further includes an elastic element, which has an end pushing against the seat and another end pushing against the corresponding movable member.

In the above embodiment, the movable handle further includes a sleeve, which is fitted around the elastic element to limit a range within which the elastic element can move.

In the above embodiment, the movable member or the corresponding movable member can cause the working section to move by a distance.

In the above embodiment, the working section can be moved by a distance ranged between 0.5 mm and 500 mm.

In the above embodiment, the movable handle further includes a limiting element, which is fixed to the seat to extend through the movable member or the corresponding movable member for limiting a moving distance allowed for the movable member or the corresponding movable member.

In the above embodiment, the movable handle further includes a retaining member and a working section, and the movable member has an operation portion. The retaining member is connected to or pressed against the operation portion; and the working section has an end pressed against or interfering with the movable member.

In the above embodiment, the movable handle further includes an elastic element, which has an end pushing against the working section and another end pushing against the seat.

In the above embodiment, the actuation portion can be a cavity, a hole, a flat surface, a cambered surface, a curved surface, a protrusion or a recess.

In the above embodiment, the corresponding movable member has a working section integrally formed therewith or assembled thereto.

In summary, the movable handle according to the present invention has a seat connected to an object, and a movable member movably assembled to the seat and can therefore be turned, or moved upward and downward, or moved leftward and rightward relative to the seat and the object.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
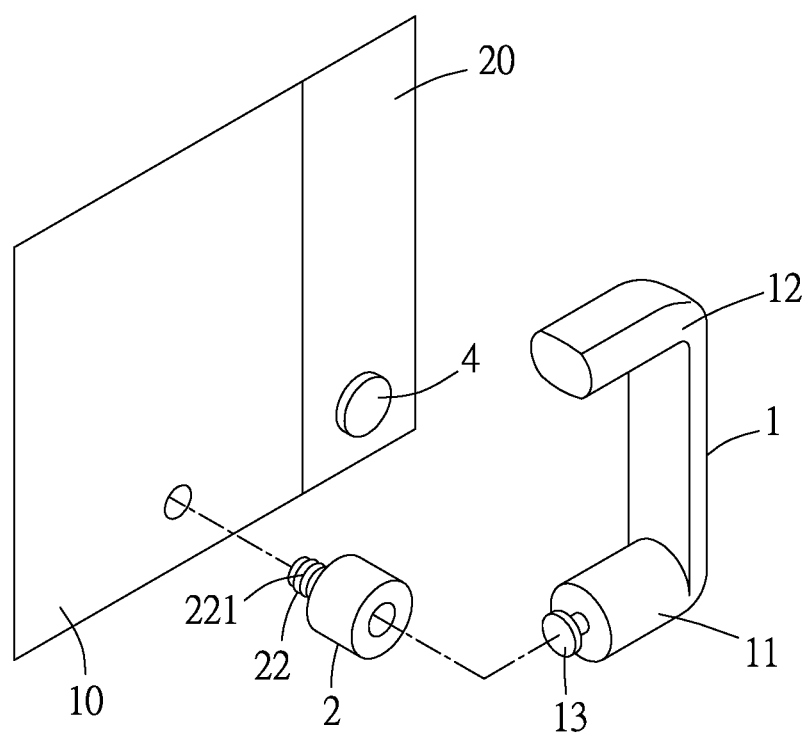
FIG. 1 is an exploded perspective view of a movable handle according to a first preferred embodiment of the present invention.

The present invention will now be described with some preferred embodiments thereof and by referring to the accompanying drawings. For the purpose of easy to understand, elements that are the same in the preferred embodiments are denoted by the same reference numerals.

Figure 2:
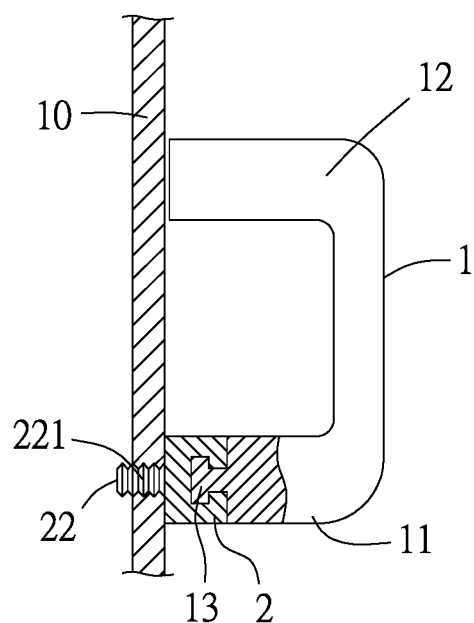
FIG. 2 is an assembled, partially sectioned side view of the movable handle according to the first preferred embodiment as shown in FIG. 1.
Figure 3:
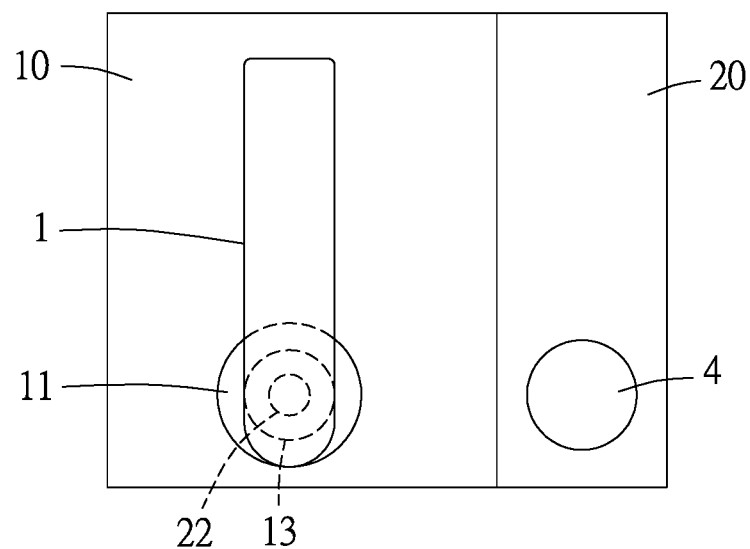
FIG. 3 is a front view of the movable handle according to the first preferred embodiment as shown in FIG. 1.
Figure 4:
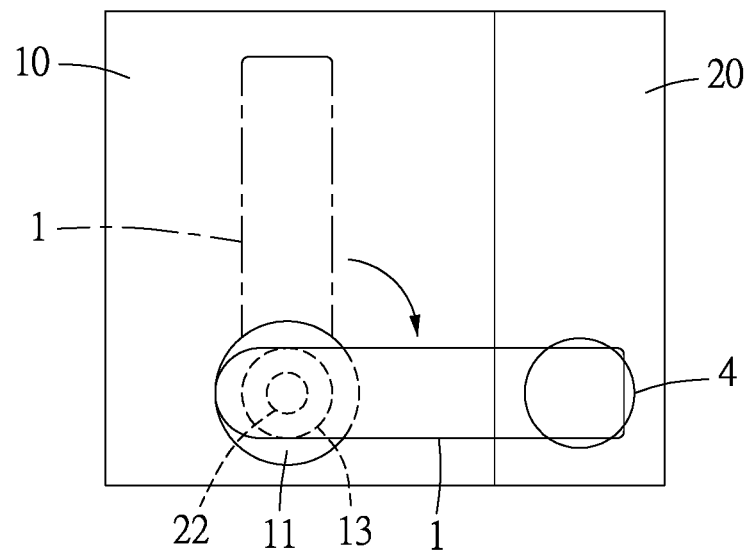
FIG. 4 is a front view showing a movable member of the movable handle of FIG. 1 is turned.

Please refer to FIGS. 1, 2 and 3. A movable handle according to a first preferred embodiment of the present invention includes a movable member 1, which can be made of a plastic material, a metal material or a composite material; and a seat, which can be made of a plastic material, a metal material or a composite material. The movable member 1 can be configured to include a main body 11 and a bent portion 12. The main body 11 can be a bar-shaped body, a block-like body, a ball-shaped body, a wedge-shaped body or any other suitably shaped body. The bent portion 12 can be bent inward, outward or in any other suitable direction relative to the main body 11. The main body 11 of the movable member 1 is movably assembled to the seat 2, such that the movable member 1 can be moved relative to the seat 2. The seat 2 is connected to a first object 10, such that the movable member 1 is indirectly connected to the first object 10 via the seat 2 and can be turned, as shown in FIGS. 3 and 4, or moved upward and downward, or moved leftward and rightward on and relative to the first object 10. Therefore, the movable member 1 and the seat 2 together constitute the movable handle of the present invention.

Figure 6:
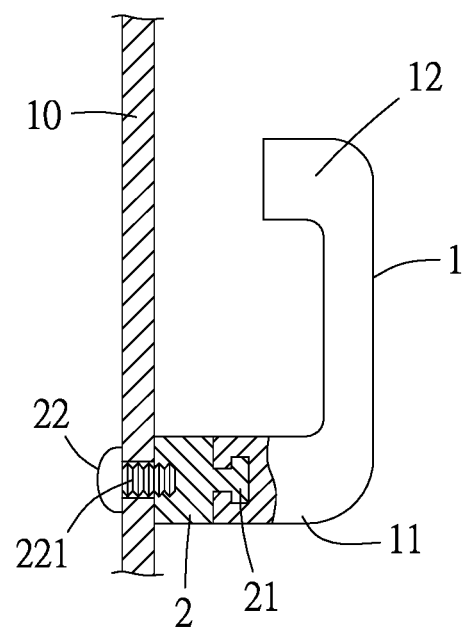
FIG. 6 is an assembled, partially sectioned side view showing a variant of the movable handle according to the first preferred embodiment, in which a seat of the movable handle includes a second coupling section.

As shown in FIGS. 1 to 3, the movable member 1 preferably includes a first coupling section 13 for movably assembling to the seat 2. With the first coupling section 13 movably assembled to the seat 2, the movable member 1 can be turned, as shown in FIGS. 3 and 4, or moved upward and downward, or moved leftward and rightward relative to the seat 2 and the first object 10. Alternatively, as shown in FIG. 6, according to a variant of the first preferred embodiment, the seat 2 preferably includes a second coupling section 21, to which the main body 11 of the movable member 1 is movably assembled. With the main body 11 of the movable member 1 movably assembled to the second coupling section 21, the movable member 1 can also be turned, or moved upward and downward, or moved leftward and rightward relative to the seat 2 and the first object 10. The first coupling section 13 or the second coupling section 21 can be configured as a fastening section, a threaded section, a boss section, a female fastener, a male fastener, a protruded section, a recessed section, or a strip.

Figure 7:
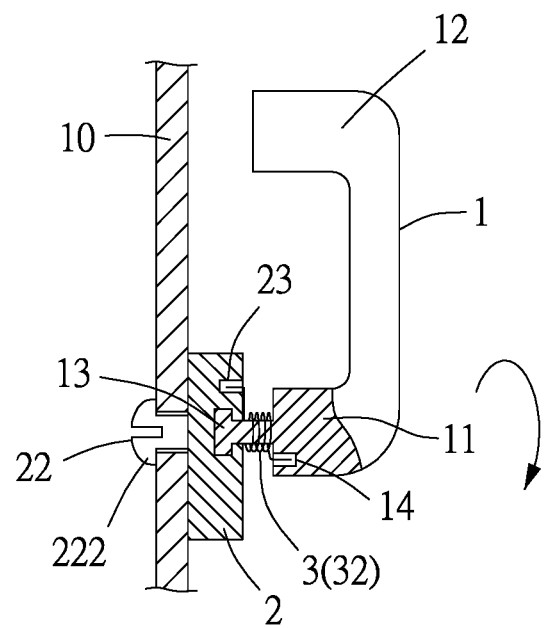
FIG. 7 is an assembled, partially sectioned side view showing the movable handle according to the first preferred embodiment includes an elastic element in the form of a torsion spring.
Figure 8:
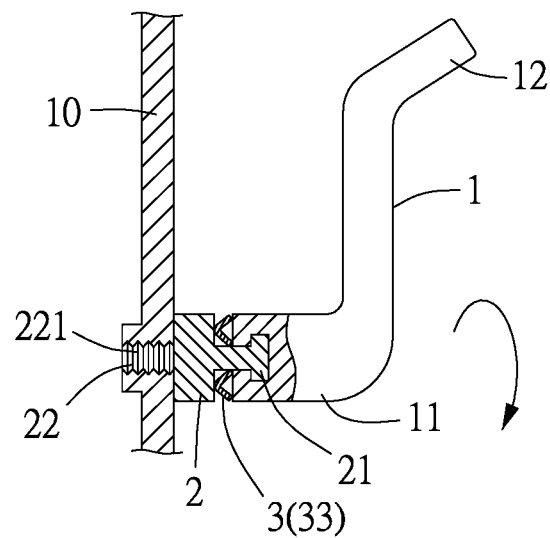
FIG. 8 is an assembled, partially sectioned side view showing the movable handle according to the first preferred embodiment includes an elastic element in the form of a flat spring.
Figure 9:
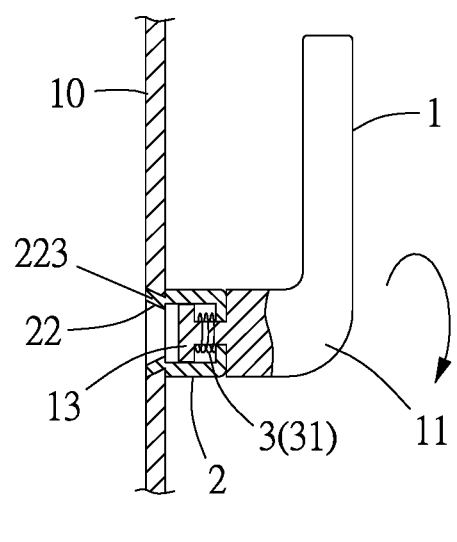
FIG. 9 is an assembled, partially sectioned side view showing the movable handle according to the first preferred embodiment includes an elastic element in the form of a coil spring.
Figure 10:
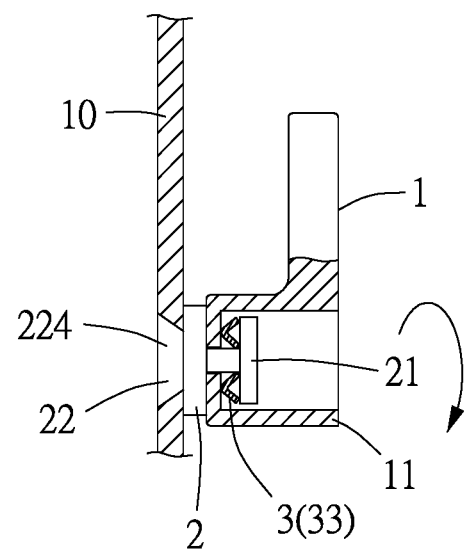
FIG. 10 is an assembled, partially sectioned side view showing another variant of the movable handle according to the first preferred embodiment, in which the elastic element is also a flat spring.

As shown in FIGS. 1 to 3, the seat 2 preferably includes a connecting section 22 for connecting to the first object 10, such that a screw fastening structure 221, as shown in FIGS. 2, 6 and 8, a snap-on fastening structure 222, as shown in FIG. 7, an expanded connection structure 223, as shown in FIG. 9, a riveting structure 224, as shown in FIG. 10, a welding structure, a glue-bonding structure or a magnetic fastening structure can be achieved between the connecting section 22 and the first object 10.

Please refer to FIGS. 7 and 9. In the first preferred embodiment, the movable handle preferably further includes an elastic element 3, which is preferably disposed between the main body 11 of the movable member 1 and the seat 2, such that the elastic element 3 has an end pushing against the main body 11 of the movable member 1 and another end pushing against the seat 2. More specifically, the elastic element 3 is fitted around the first coupling section 13 of the movable member 1 with one end pushing against the main body 11 of the movable member 1 and another end pushing against the seat 2. Alternatively, as shown in FIGS. 8 and 10, according to the variant of the first preferred embodiment of the present invention, the elastic element 3 is fitted around the second coupling section 21 with one end pushing against the main body 11 of the movable member 1 and another end pushing against the seat 2.

The elastic element 3 can be a coil spring 31, as shown in FIG. 9, a torsion spring 32, as shown in FIG. 7, a flat spring 33, as shown in FIGS. 8 and 10, or an elastic bar (not shown). Preferably, the elastic element 3 is a torsion spring 32 (see FIG. 7) capable of driving the movable member 1 to turn. More specifically, in the case the elastic element 3 used is a torsion spring as shown in FIG. 7, the main body 11 of the movable member 1 can include a first abutting section 14 and the seat 2 can include a second abutting section 23. The first abutting section 14 and the second abutting section 23 can be in the form of a hole or a boss. The elastic element 3 has one end interfered by the first abutting section 14 and another end interfered by the second abutting section 23. In the case the elastic element 3 used is a coil spring 31 (see FIG. 9) or a flat spring 33 (see FIGS. 8 and 10), the elastic element 3 can exert a spring force on the movable member 1 and therefore produces a frictional resistance between the movable member 1 and the seat 2 or the elastic element 3 when the movable member 1 is moved.

Figure 5:
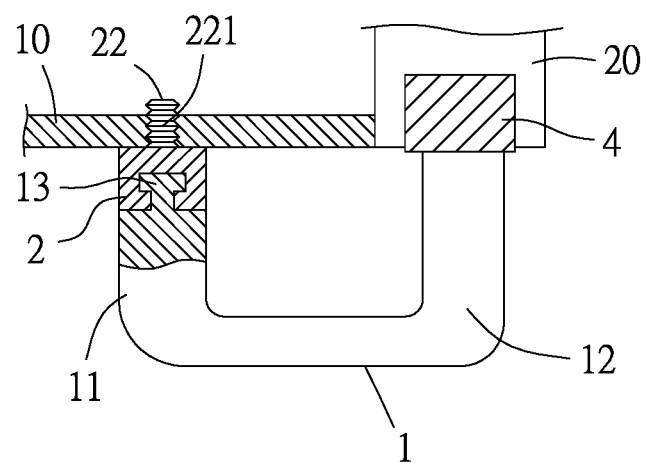
FIG. 5 is an assembled, partially sectioned top view showing the movable member of the movable handle of FIG. 1 is moved to actuate an actuator member.

Referring back to FIGS. 1 to 3. When the movable member 1 is turned, moved upward or downward, or moved leftward or rightward, the bent portion 12 or some other portion of the movable member 1 is brought to actuate an actuator member 4 or some other intended member by, for example, pushing against it as shown in FIG. 5, so that the actuator member 4 or the intended member can actuate some intended function. The actuator member 4 or the intended member can be installed on a second object 20 or on the first object 10 to be functionally operable.

Figure 11:
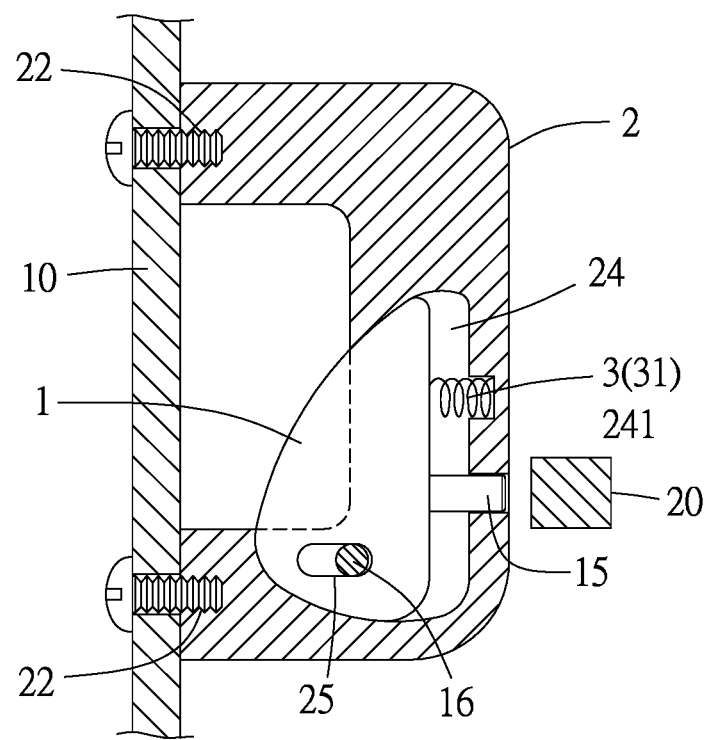
FIG. 11 is an assembled, partially sectioned side view showing the movable handle according to a second preferred embodiment of the present invention.
Figure 12:
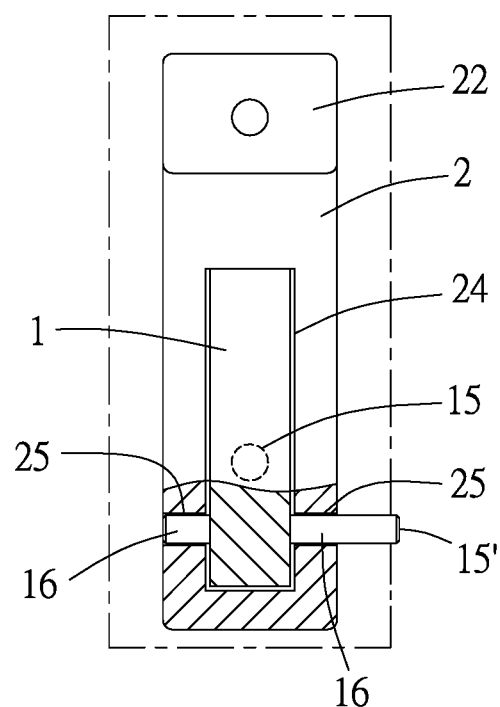
FIG. 12 is a partially sectioned front view of the movable handle according to the second preferred embodiment as shown in FIG. 11.
Figure 13:
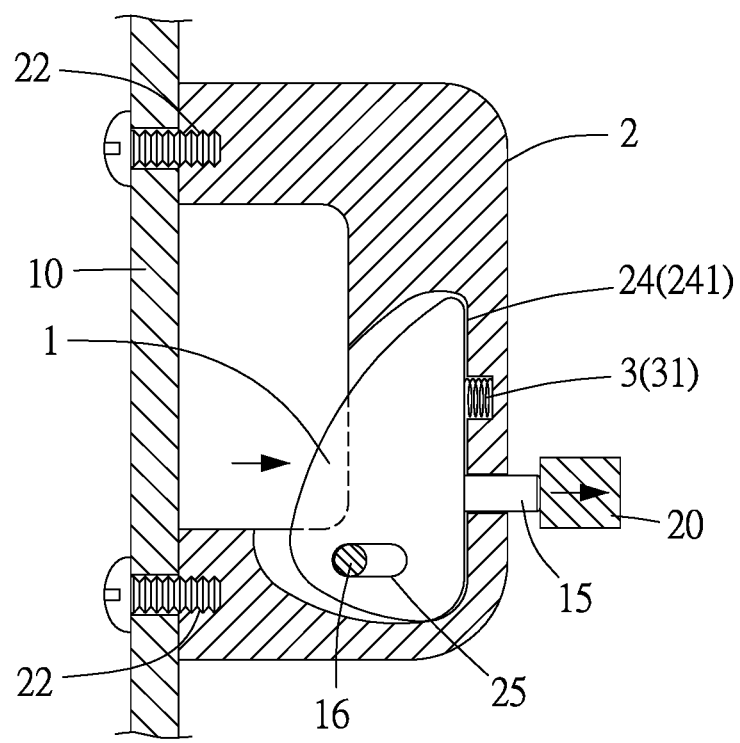
FIG. 13 is an assembled, partially sectioned side view showing a movable member of the movable handle of FIG. 11 is moved.
Figure 15:
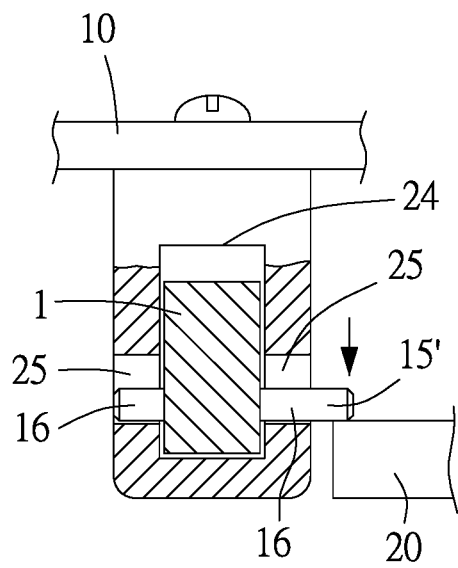
FIG. 15 is a second partially sectioned top view showing the movable member of the movable handle of FIG. 11 is moved to cause moving of a second object.
Figure 14:
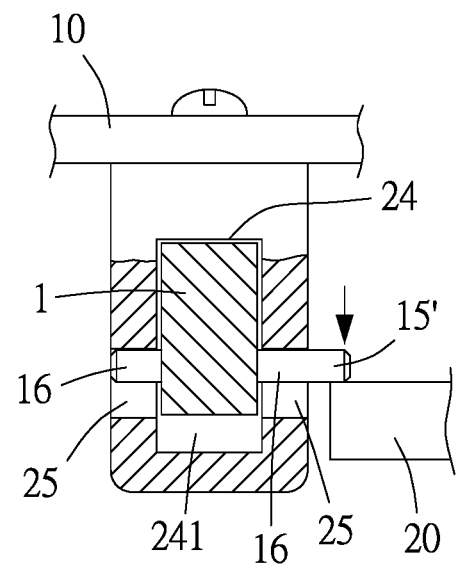
FIG. 14 is a first partially sectioned top view showing the movable member of the movable handle of FIG. 11 is moved to cause moving of a second object.
Figure 16:
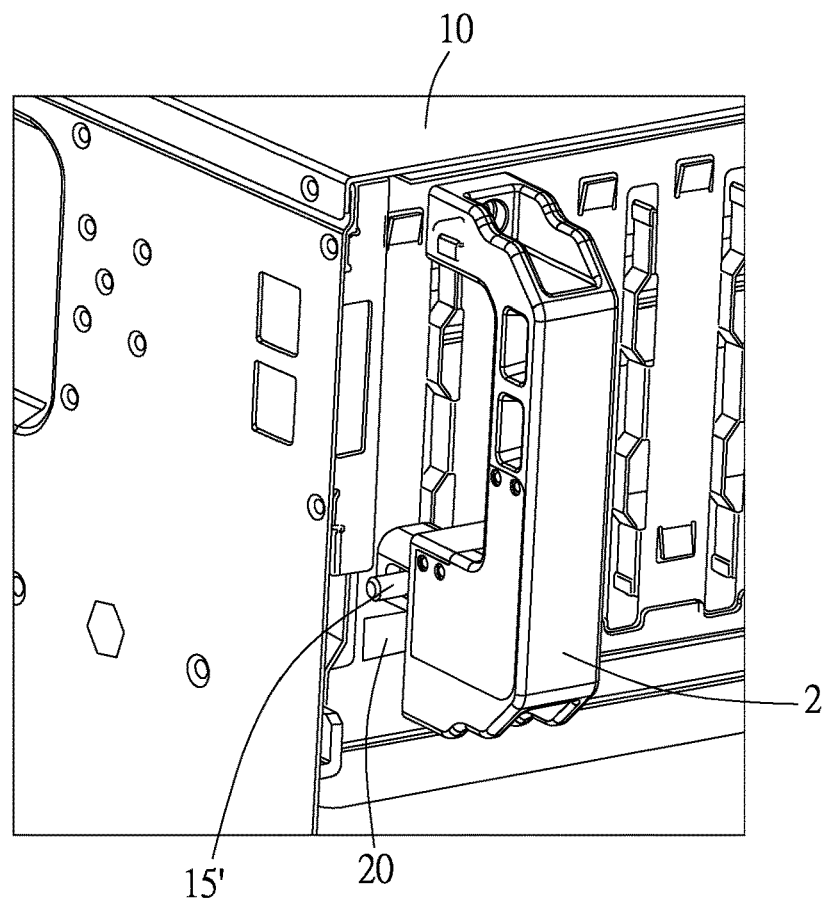
FIG. 16 is a perspective view showing the movable handle according to a third preferred embodiment of the present invention in use.
Figure 17:
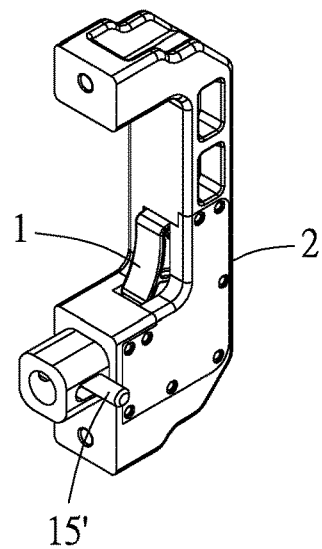
FIG. 17 is a perspective view of the movable handle according to the third preferred embodiment of the present invention.
Figure 18:
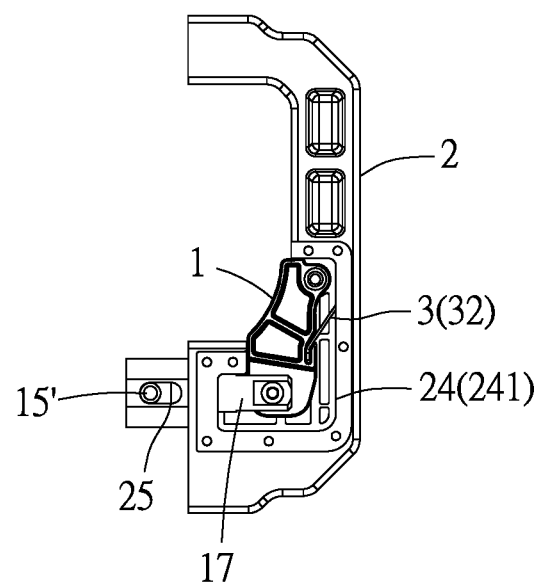
FIG. 18 is a cutaway view of the movable handle according to the third preferred embodiment as shown in FIG. 17.
Figure 19:
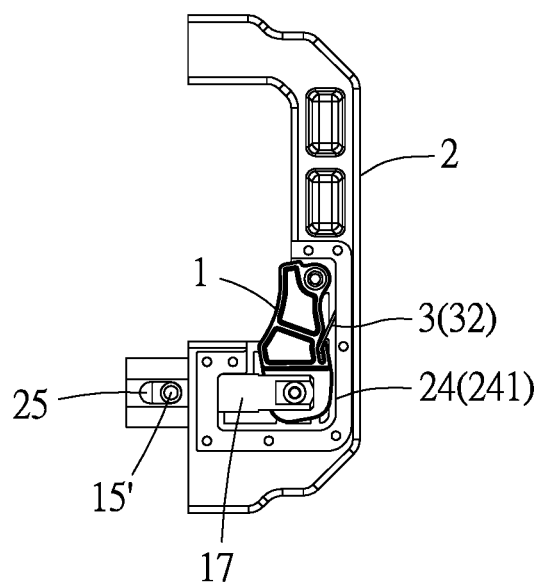
FIG. 19 is a cutaway view showing a movable member of the movable handle of FIG. 17 is moved.

FIGS. 11 and 12 illustrate the movable handle according to a second preferred embodiment of the present invention; and FIGS. 16 to 18 illustrate the movable handle according to a third preferred embodiment of the present invention. As shown, both of the second and third embodiments include a movable member 1 and a seat 2. The movable member 1 is movably or pivotally assembled to the seat 2, so that the movable member 1 can be moved on and relative to the seat 2, as shown in FIGS. 13 and 19. Wherein, the seat 2 can be configured as a handle or any other intended shape, such as a lying U-shaped member, a straight bar-shaped member, or any other suitable shape. Further, a connecting section 22 is formed at one end or each of two ends of the seat 2 for connecting to a first object 10 by screw fastening, snap-on fastening, riveting, expanded connection, welding, glue bonding or magnetic fastening. The movable member 1 can be configured as a handle, a push key, a push button, a joystick, a block or any other suitable shape, so long as the movable member 1 can be movably assembled (see FIG. 12) or pivotally assembled (see FIG. 18) to the seat 2 for moving inside or outside the seat 2 to drive a second object 20 to move, as shown in FIGS. 13, 14 and 15.

As can be seen in FIGS. 11, 12 and 18, a selected side of the seat 2, such as an inner side thereof, can be provided with a cavity 24 or a hole, such that the movable member 1 is movably mounted or pivotally connected to the cavity 24 or the hole while a retraction space 241 is defined between the cavity 24 or the hole and the movable member 1, allowing the movable member 1 to move in the cavity 24 or the hole.

Figure 21:
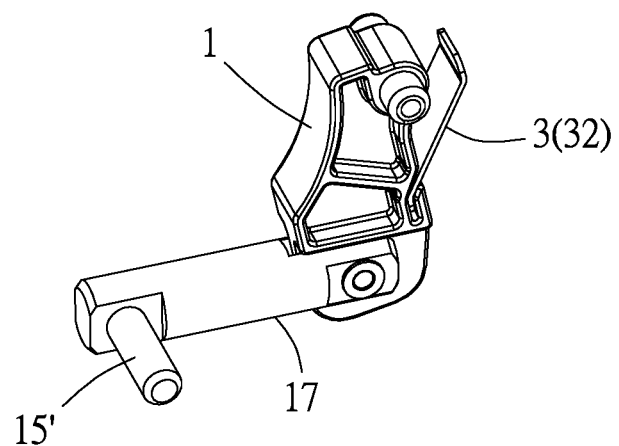
FIG. 21 shows a working rod and a working section of the movable handle according to the third preferred embodiment as shown in FIG. 17.

Further, the movable member 1 can be provided with a working section 15, 15' that is movable inside the seat 2 or outside the seat 2. The working section 15, 15' can be a rod, a post, a block, a ball or any other suitable form. The working section 15, 15' can be assembled to or integrally formed on any side of the movable member 1, as shown in FIG. 11 or 12, to be movable inside or outside the seat 2. When the movable member 1 is operated and moved, the working section 15, 15' is caused to move a second object 20, as shown in FIGS. 13, 14 and 15. Alternatively, as shown in FIGS. 18, 19 and 21, the working section 15' can be associated with a working rod 17, which is pivotally connected to the movable member 1. Therefore, when the movable member 1 is operated and moved, the working rod 17 and the working section 15' are caused to move at the same time.

Figure 20:
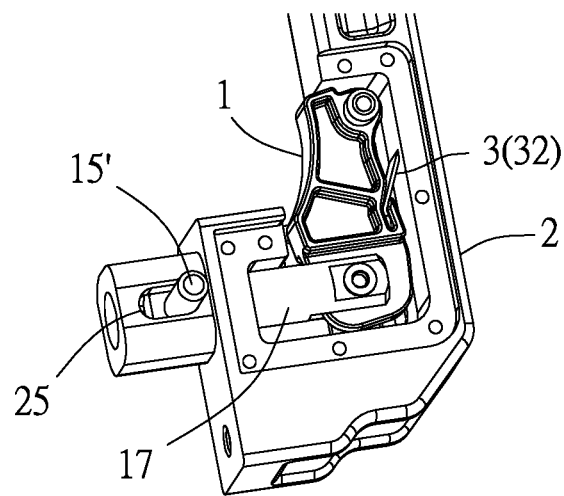
FIG. 20 is a fragmentary, enlarged cutaway view of the movable handle according to the third preferred embodiment as shown in FIG. 17.

In the second preferred embodiment shown in FIGS. 11 and 12, as well as in the third preferred embodiment shown in FIGS. 18, 20 and 21, the movable handle can further include an elastic element 3. The elastic element 3 can be disposed inside or outside the cavity 24, and can be a coil spring 31, a torsion spring 32 or a flat spring 33, as shown in FIGS. 19 and 21. Or, the elastic element 3 can be an elastic bar (not shown). The elastic element 3 has an end pushing against the movable member 1 and another end pushing against the seat 2. With these arrangements, the elastic element 3 can exert a spring force on the operated movable member 1 for the same to return to its original position or to do other actions.

Again, as shown in FIGS. 11 and 12, the movable member 1 in the second preferred embodiment can include an interfering section 16 movably assembled to the seat 2. The interfering section 16 can be a rod, a post, a block, a ball or any other suitable form. The interfering section 16 can be assembled to or integrally formed with the movable member 1. In an operable embodiment, the interfering section 16 can also be extended beyond the working section 15', so that the working section 15' is movable inside or outside the seat 2 and can be caused to move a second object 20, as shown in FIGS. 13 to 15. Meanwhile, the seat 2 in the second preferred embodiment can include an elongated slot 25 or an elongated hole, such that the interfering section 16 and the working section 15' are movable only within a range defined by the elongated slot 25 or the elongated hole.

In the second preferred embodiment that includes the interfering section 16, the movable handle can also further include an elastic element 3. The elastic element 3 can be a coil spring 31, a torsion spring 32, a flat spring 33 or an elastic bar. The elastic element 3 has an end pushing against the movable member 1 and another end pushing against the seat 2. The elastic element 3 can exert a spring force on the operated movable member 1 for the same to return to its original position or to do other actions.

Figure 22:
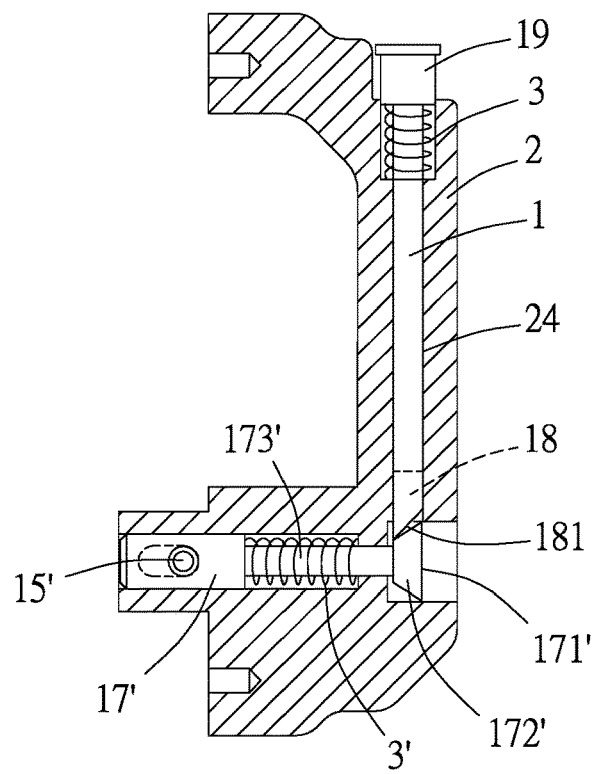
FIG. 22 is a sectioned side view of the movable handle according to a fourth preferred embodiment of the present invention.
Figure 23:
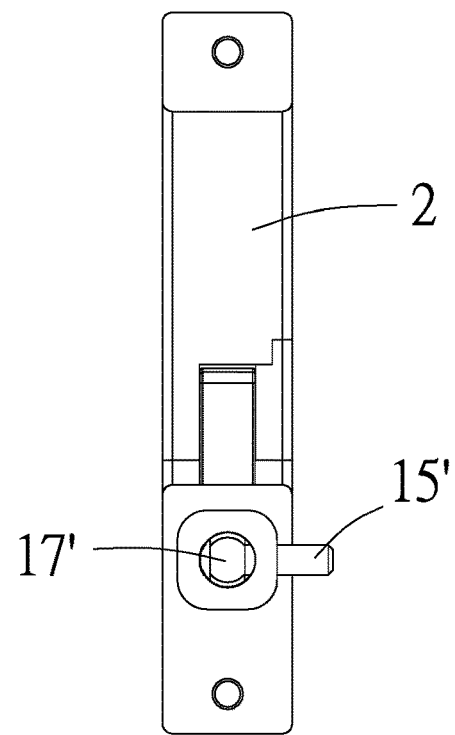
FIG. 23 is a rear view of the movable handle according to the fourth preferred embodiment as shown in FIG. 22.
Figure 24:
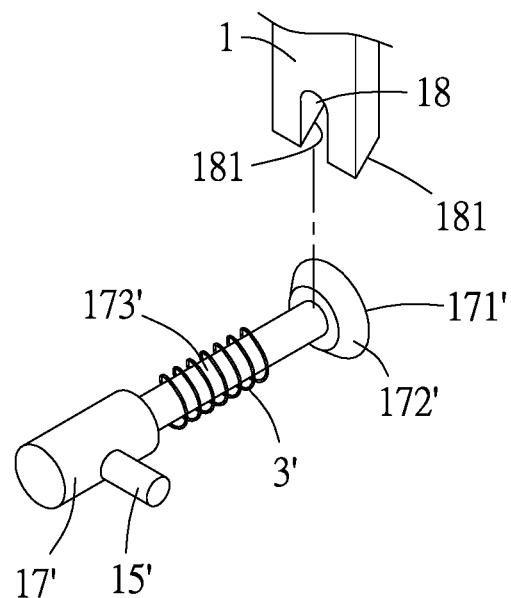
FIG. 24 is a fragmentary, exploded perspective view showing an actuation portion and a corresponding movable member of the movable handle according to the fourth preferred embodiment as shown in FIG. 22.

FIGS. 22, 23 and 24 illustrate the movable handle according to a fourth preferred embodiment of the present invention. As shown, in the fourth preferred embodiment, the movable handle also includes a movable member 1 and a seat 2. The seat 2 in the fourth preferred embodiment is structurally similar to those in the second and third embodiments and includes a cavity 24. The movable member 1 is linearly movably disposed in the cavity 24 of the seat 2. An end of the movable member 1 has an actuation portion 18 for causing another member to move and a corresponding movable member 17 that can be moved accordingly, and an opposite end of the movable member 1 has an operation portion 19 for operating the actuation portion 18 and accordingly driving the corresponding movable member 17' via the actuation portion 18. More specifically, the actuation portion 18 of the movable member 1 can drive the corresponding movable member 17' at a head portion 171' or a shank portion 173' thereof to move the corresponding movable member 17'. The actuation portion 18 has a bevel surface 181 and the head portion 171' has a bevel surface 172', such that the bevel surface 181 of the actuation portion 18 pushes against the bevel surface 172' of the head portion 171'. In other operable embodiments, the actuation portion 18 and the head portion 171' can respectively have a cambered surface or a curved surface. With the above arrangements of the fourth preferred embodiment, the corresponding movable member 17' can cause a working section 15' to move. More specifically, the movable member 1 or the corresponding movable member 17' can cause the working section 15' to move by a distance ranged between 0.5 mm and 500 mm. Further, the corresponding movable member 17' and the working section 15' can be integrally formed or be assembled to each other.

Figure 25:
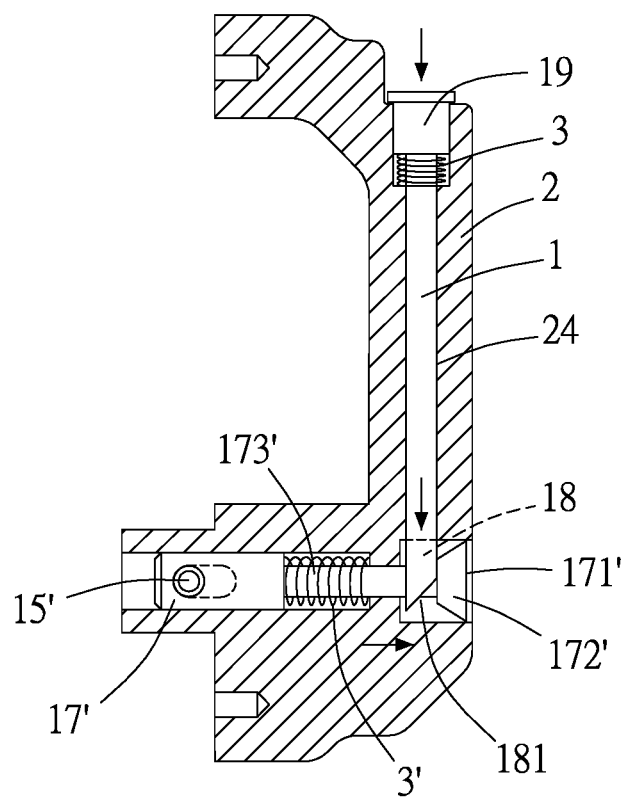
FIG. 25 is an assembled sectioned side view showing the operation of the movable handle according to the fourth preferred embodiment as shown in FIG. 22.

As can be seen in FIGS. 22 and 25, the movable handle in the fourth preferred embodiment can further include an elastic element 3, which has an end pushing against the operation portion 19 of the movable member 1 and another end pushing against the cavity 24 of the seat 2 for elastically pushing the moved movable member 1 back to its original position; and another elastic element 3', which has an end pushing against the seat 2 and another end pushing against the corresponding movable member 17' for elastically pushing the moved corresponding movable member 17' back to its original position.

Figure 26:
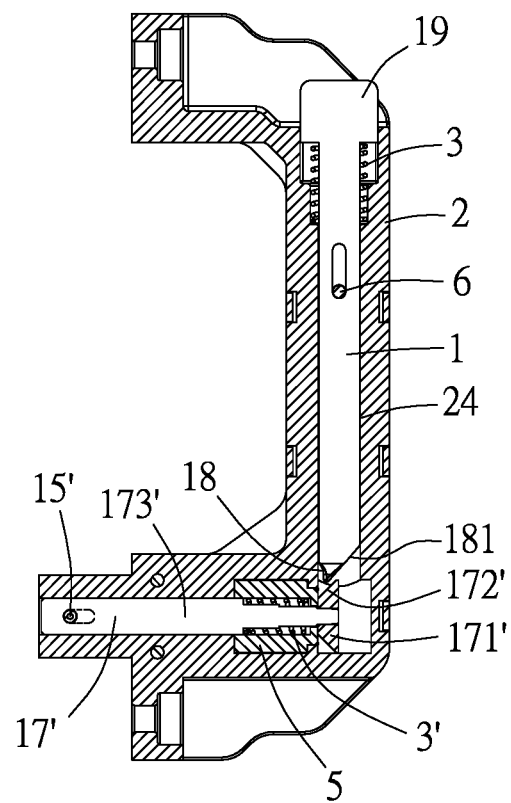
FIG. 26 is a sectioned side view of the movable handle according to a fifth preferred embodiment of the present invention.
Figure 27:
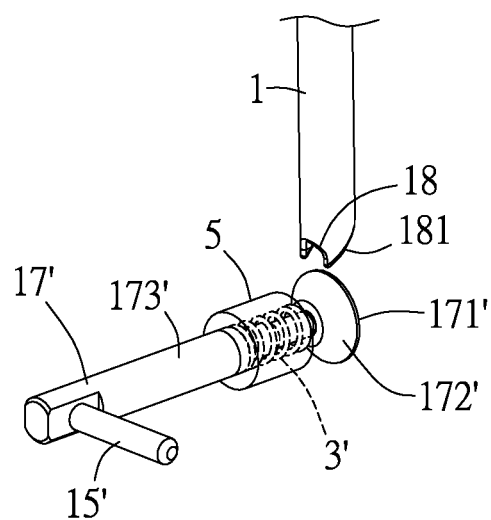
FIG. 27 is a fragmentary, exploded perspective view showing an actuation portion and a corresponding movable member of the movable handle according to the fifth preferred embodiment as shown in FIG. 26.

FIGS. 26 and 27 illustrate the movable handle according to a fifth preferred embodiment of the present invention. As shown, the movable handle in the fifth preferred embodiment is structurally similar to the fourth preferred embodiment but further includes a sleeve 5 fitted around the elastic element 3' to limit the range within which the elastic element 3' can move.

As can be seen in FIG. 26, the movable handle in the fifth preferred embodiment further includes a limiting element 6, which is fixed to the seat 2 to extend through the movable member 1 or the corresponding movable member 17' to limit the maximum moving distance allowed for the movable member 1 or the corresponding movable member 17'.

Figure 28:
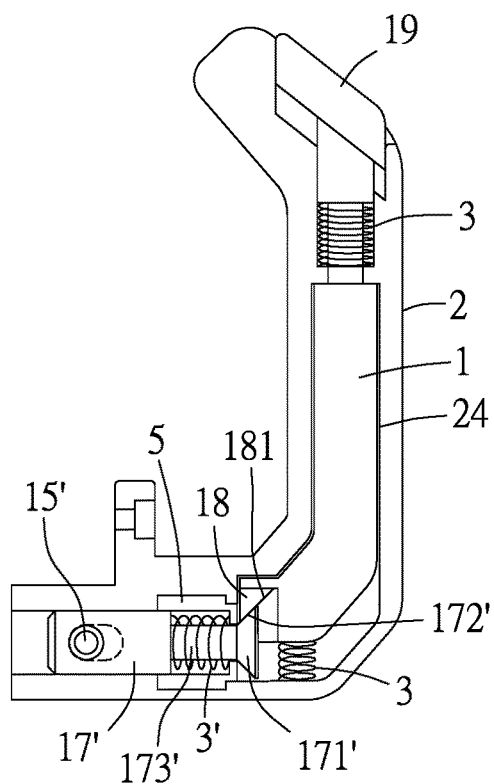
FIG. 28 is a sectioned side view of the movable handle according to a sixth preferred embodiment of the present invention.
Figure 29:
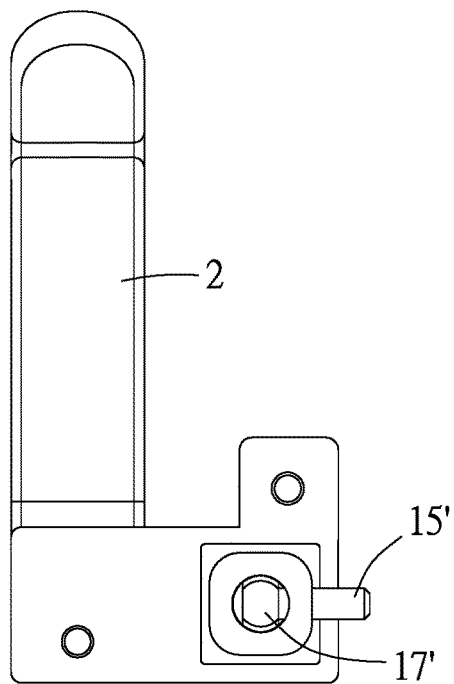
FIG. 29 is a rear view of the movable handle according to the sixth preferred embodiment as shown in FIG. 28.
Figure 30:
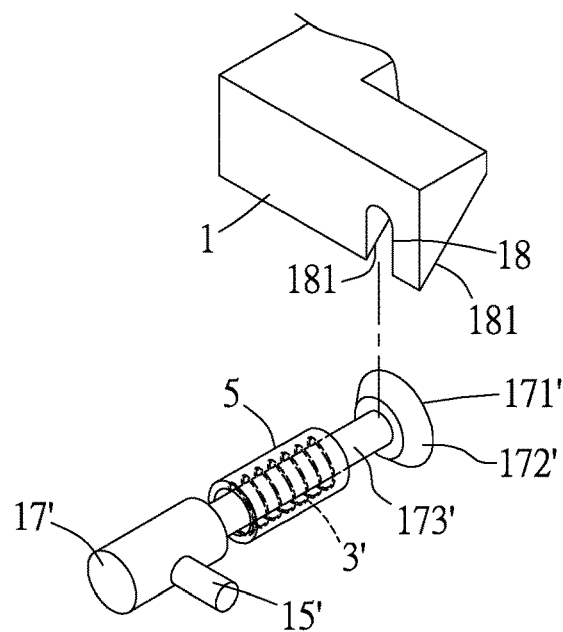
FIG. 30 is a fragmentary, exploded perspective view showing an actuation portion and a corresponding movable member of the movable handle according to the sixth preferred embodiment as shown in FIG. 28.

FIGS. 28, 29 and 30 illustrate the movable handle according to a sixth preferred embodiment of the present invention. As shown, the movable handle in the sixth preferred embodiment also includes a movable member 1 and a seat 2. The seat 2 in the sixth preferred embodiment is structurally similar to those in the second and third embodiments and includes a cavity 24. The movable member 1 is linearly movably disposed in the cavity 24 of the seat 2 and includes a bend. An end of the movable member 1 has an actuation portion 18 for causing another member to move and a corresponding movable member 17 that can be moved accordingly, and an opposite end of the movable member has an operation portion 19 for operating the actuation portion 18 and accordingly driving the corresponding movable member 17' via the actuation portion 18. More specifically, the actuation portion 18 of the movable member 1 can drive the corresponding movable member 17' at a head portion 171' thereof to move the corresponding movable member 17'. The actuation portion 18 has a bevel surface 181 and/or the head portion 171' has a bevel surface 172', such that the bevel surface 181 of the actuation portion 18 can push against the bevel surface 172' of the head portion 171'. With the above arrangements of the sixth preferred embodiment, the corresponding movable member 17' can cause a working section 15' to move. More specifically, the movable member 1 or the corresponding movable member 17' can cause the working section 15' to move by a distance ranged between 0.5 mm and 500 mm.

Figure 31:
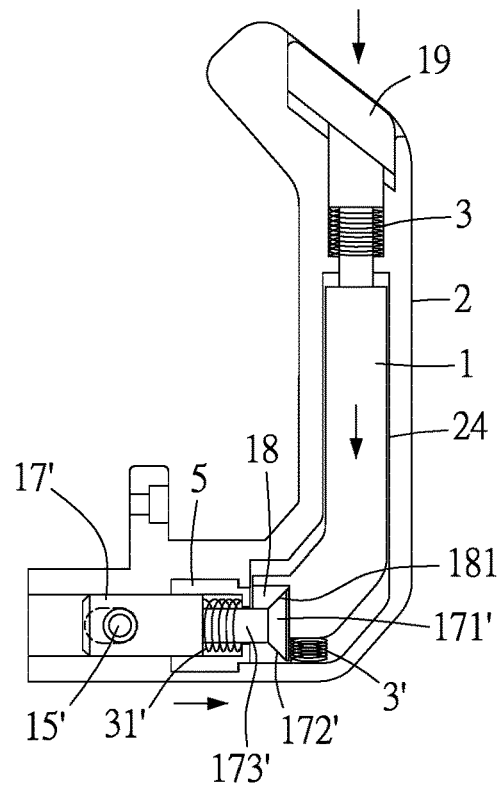
FIG. 31 is an assembled sectioned side view showing the operation of the movable handle according to the sixth preferred embodiment as shown in FIG. 28.

As can be seen in FIGS. 28 and 31, the movable handle in the sixth preferred embodiment can further include an elastic element 3, which has an end pushing against the operation portion 19 of the movable member 1 and another end pushing against the cavity 24 of the seat 2 for elastically pushing the moved movable member 1 back to its original position; and another elastic element 3', which has an end pushing against the seat 2 and another end pushing against the corresponding movable member 17' for elastically pushing the moved corresponding movable member 17' back to its original position.

Further, the movable handle in the sixth preferred embodiment also includes a sleeve 5 fitted around the second elastic element 3' to limit the range within which the second elastic element 3' can move.

Figure 32:
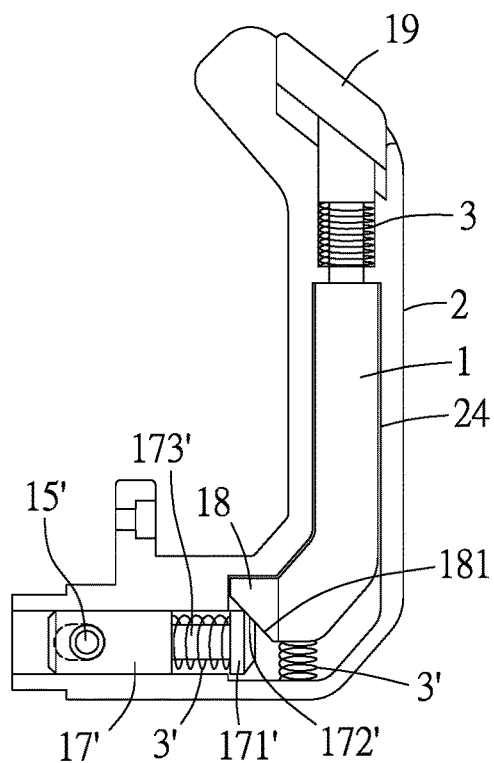
FIG. 32 is a sectioned side view of the movable handle according to a seventh preferred embodiment of the present invention.
Figure 33:
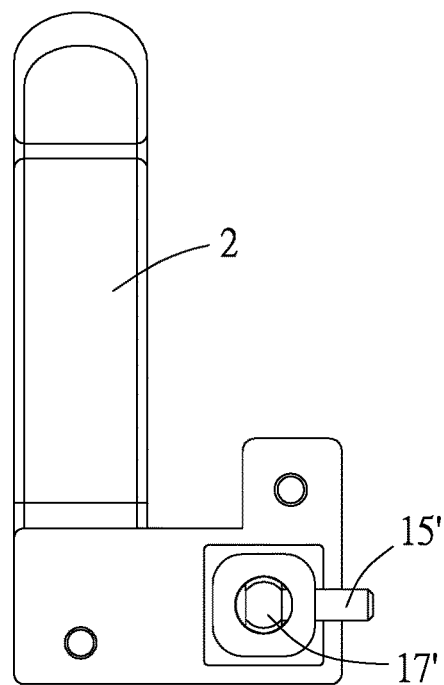
FIG. 33 is a rear view of the movable handle according to the seventh preferred embodiment as shown in FIG. 32.
Figure 34:
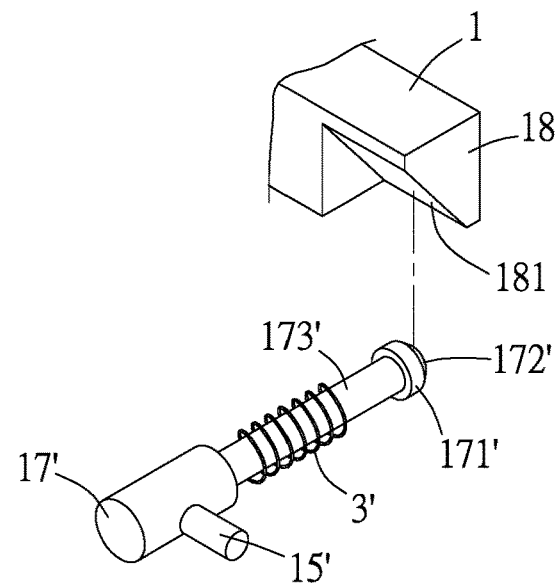
FIG. 34 is a fragmentary, exploded perspective view showing an actuation portion and a corresponding movable member of the movable handle according to the seventh preferred embodiment as shown in FIG. 32.

FIGS. 32, 33 and 34 illustrate the movable handle according to a seventh preferred embodiment of the present invention. As shown, the movable handle in the seventh preferred embodiment also includes a movable member 1 and a seat 2. The seat 2 in the seventh preferred embodiment is structurally similar to that in the sixth embodiment and includes a cavity 24. The movable member 1 is linearly movably disposed in the cavity 24 of the seat 2 and includes a bend. An end of the movable member 1 has an actuation portion 18 for causing another member to move and a corresponding movable member that can be moved correspondingly, and an opposite end of the movable member has an operation portion 19 for operating the actuation portion 18 and accordingly driving the corresponding movable member 17' via the actuation portion 18. The actuation portion 18 can be in the form of a cavity, a hole, a flat surface, a cambered surface, a curved surface, a protrusion or a recess. More specifically, the actuation portion 18 of the movable member 1 can drive the corresponding movable member 17' at a head portion 171' thereof to move the corresponding movable member 17'. The actuation portion 18 has a bevel surface 181 and/or the head portion 171' has a bevel surface 172', such that the bevel surface 181 of the actuation portion 18 can push against the bevel surface 172' of the head portion 171'. With the above arrangements of the seventh preferred embodiment, the corresponding movable member 17' can cause a working section 15' to move. More specifically, the movable member 1 or the corresponding movable member 17' can cause the working section 15' to move by a distance ranged between 0.5 mm and 500 mm.

Figure 35:
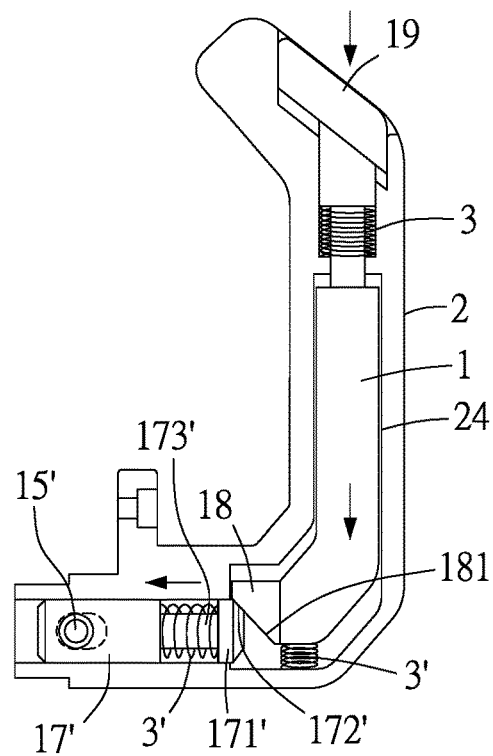
FIG. 35 is an assembled sectioned side view showing the operation of the movable handle according to the seventh preferred embodiment as shown in FIG. 32.
Figure 36:
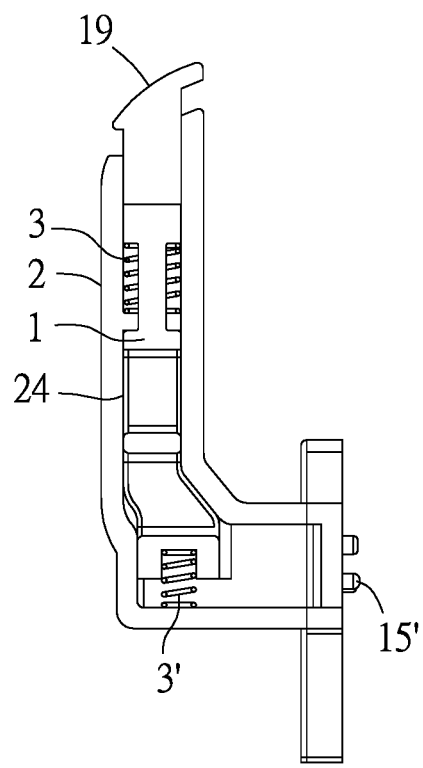
FIG. 36 is a first sectioned side view showing the movable handle according to an eighth preferred embodiment of the present invention.
Figure 37:
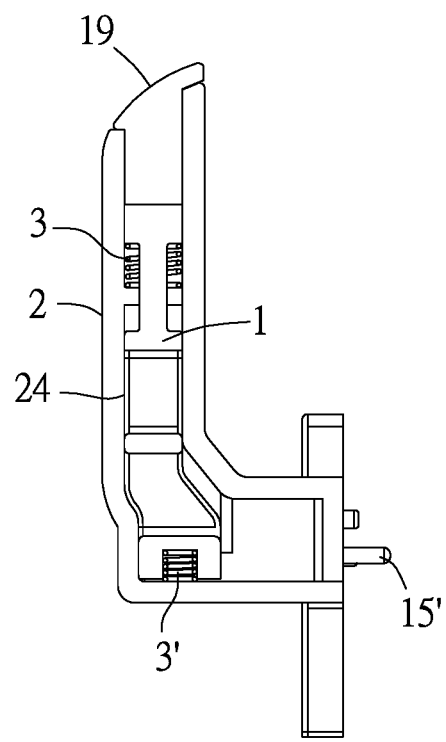
FIG. 37 is a second sectioned side view of the movable handle according to the eighth preferred embodiment of the present invention showing the operation thereof.
Figure 38:
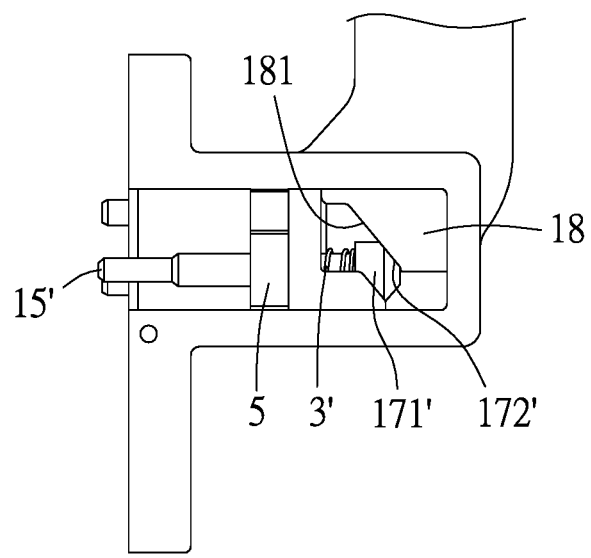
FIG. 38 is a third sectioned side view of the movable handle according to the eighth preferred embodiment of the present invention showing the operation thereof.
Figure 39:
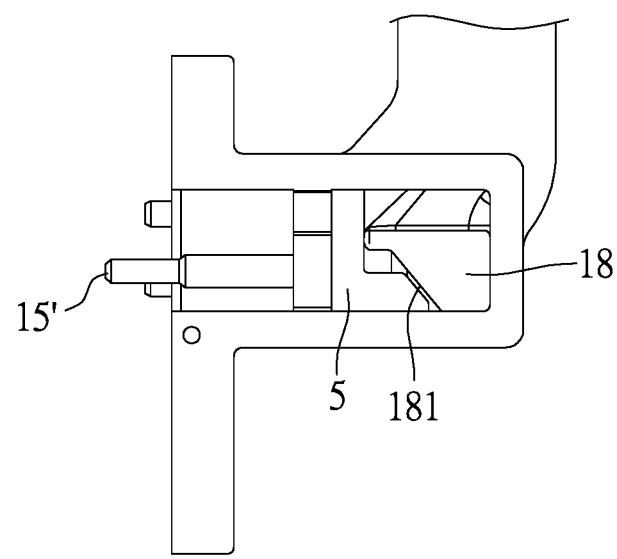
FIG. 39 is a fourth sectioned side view of the movable handle according to the eighth preferred embodiment of the present invention showing the operation thereof.

As can be seen in FIGS. 32 and 35, the movable handle in the seventh preferred embodiment can further include n elastic element 3, which has an end pushing against the operation portion 19 of the movable member 1 and another end pushing against the cavity 24 of the seat 2 for elastically pushing the moved movable member 1 back to its original position; and another elastic element 3', which has one end pushing against the seat 2 and another end pushing against the corresponding movable member 17' for elastically pushing the moved corresponding movable member 17' back to its original position. Please refer to FIGS. 36 to 39. According to an eighth preferred embodiment of the present invention, the movable handle has a working section 15', which can be moved to protrude from or retract into the seat 2.

Figure 40:
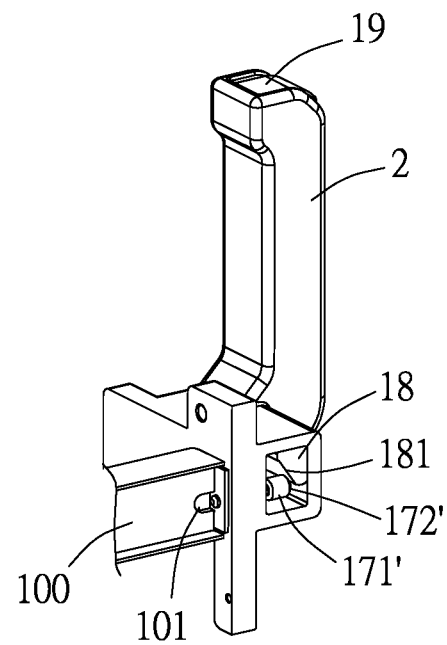
FIG. 40 shows the operation of a working section of the movable handle according to the eighth preferred embodiment of the present invention.
Figure 41:
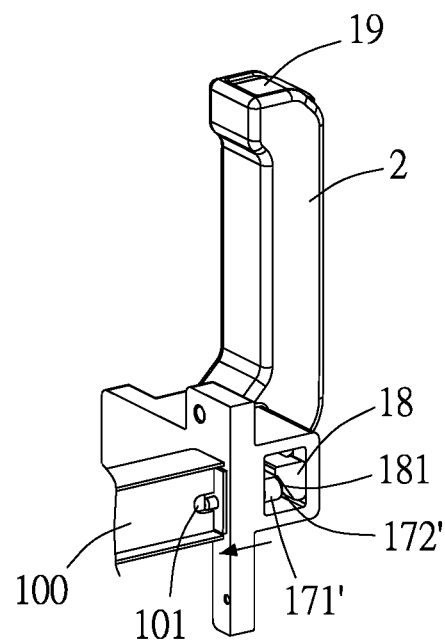
FIG. 41 shows the working section of the movable handle of FIG. 40 drives a switch of a slide rail.

As shown in FIGS. 40 and 41, in the eighth preferred embodiment, the working section 15' can be coaxial with the corresponding movable member 17'. And, when the working section 15' is moved, it can drive a switch 101 of a slide rail 100 to move.

Figure 42:
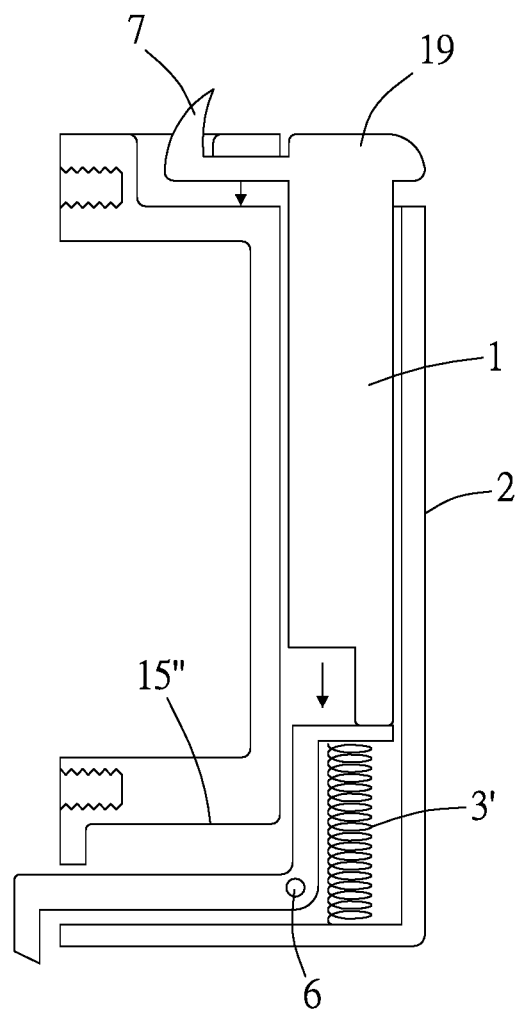
FIG. 42 is a sectioned side view of the movable handle according to a ninth preferred embodiment of the present invention.

Please refer to FIG. 42. The movable handle according to a ninth preferred embodiment of the present invention further includes a retaining member 7 and a working section 15". In the ninth embodiment, the movable member 1 is vertically movably assembled to the seat 2 and has a top serving as an operation portion 19. The retaining member 7 has some elasticity and is horizontally connected to or pressed against the operation portion 19. The working section 15" has a first horizontal end that is exposed from the seat 2 and can be hook-shaped, and a second horizontal end that is pressed against or interfering with a bottom of the movable member 1. A point of the working section 15" located between the first and the second horizontal end is pivotally connected to the seat 2 via a limiting element 6, which is provided to limit the range within which the movable member 1 can be moved. The movable handle in the ninth embodiment further includes an elastic element 3', which has an end pushing against the second horizontal end of the working section 15" and another end pushed against the seat 2. When the operation portion 19 of the movable member 1 is downward pushed, the retaining member 6 is caused to retract into the seat 2, and the bottom of the movable member 1 in contact with the second horizontal end of the working section 15" compresses the elastic element 3' to simultaneously upward move the first horizontal end of the working section 15". When the operation portion 19 of the movable member 1 is released from the downward push, the retaining member 7, the movable member 1, the elastic element 3' and the working section 15" all return to their respective original position due to an elastic restoring force of the elastic element 3'.

The present invention has been described with some preferred embodiments thereof and it is understood that the preferred embodiments are only illustrative and not intended to limit the present invention in any way and many changes and modifications in the described embodiments can be carried out without departing from the scope and the spirit of the invention that is intended to be limited only by the appended claims.

What is claimed is:

1. A movable handle, comprising:
   a movable member;
   a corresponding movable member;
   a seat having a cavity to which the movable member is mounted; and
   a first elastic element, a second elastic element, and a third elastic element;
   wherein the movable member is movably assembled to the seat, such that the movable member can be moved relative to the seat;
   wherein the movable member has an actuation portion and an operation portion for operating the actuation portion, the movable member being in one piece, the actuation portion drives the corresponding movable member;
   wherein the first elastic element has an end pushing against the operation portion and another end pushing against an upper part of the cavity for elastically pushing the moved movable member back to its original position;
   wherein the second elastic element has an end pushing against a lower part of the movable member and another end pushing against a lower part of the cavity for elastically pushing the moved movable member back to its original position, the second elastic element and the first elastic element simultaneously push the moved movable member back to its original position in the same direction;
   wherein the third elastic element has an end pushing against the seat and another end pushing against the corresponding movable member for elastically pushing the moved corresponding movable member back to its original position.

2. The movable handle as claimed in claim 1, wherein the corresponding movable member includes a working section, which is movable inside the seat or outside the seat.

* * * * *